United States Patent
Morita et al.

(10) Patent No.: US 10,096,591 B2
(45) Date of Patent: Oct. 9, 2018

(54) SEMICONDUCTOR DEVICE HAVING AN ELECTROSTATIC PROTECTION ELEMENT

(71) Applicant: SII Semiconductor Corporation, Chiba-shi, Chiba (JP)

(72) Inventors: Takeshi Morita, Chiba (JP); Kazuhiro Tsumura, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/469,803

(22) Filed: Mar. 27, 2017

(65) Prior Publication Data
US 2017/0287898 A1 Oct. 5, 2017

(30) Foreign Application Priority Data
Mar. 30, 2016 (JP) .................................. 2016-069165

(51) Int. Cl.
| | | |
|---|---|---|
| H01L 27/02 | (2006.01) | |
| H01L 21/8238 | (2006.01) | |
| H01L 27/092 | (2006.01) | |
| H01L 29/06 | (2006.01) | |
| H01L 29/36 | (2006.01) | |

(52) U.S. Cl.
CPC .. H01L 27/0266 (2013.01); H01L 21/823807 (2013.01); H01L 21/823892 (2013.01); H01L 27/0928 (2013.01); H01L 29/0611 (2013.01); H01L 29/36 (2013.01)

(58) Field of Classification Search
CPC .. H01L 29/0873–29/0886; H01L 29/36; H01L 29/7833–29/7836; H01L 29/66681–29/66704; H01L 29/7816–29/7826; H01L 27/0928; H01L 27/0266
See application file for complete search history.

(56) References Cited

U.S. PATENT DOCUMENTS

| | | | | |
|---|---|---|---|---|
| 5,369,045 A | * | 11/1994 | Ng | H01L 29/1095 148/DIG. 126 |
| 2010/0187608 A1 | * | 7/2010 | Risaki | H01L 27/0259 257/355 |

FOREIGN PATENT DOCUMENTS

JP 2007-266473 A 10/2007

* cited by examiner

*Primary Examiner* — Tucker J Wright
(74) *Attorney, Agent, or Firm* — Brinks Gilson & Lione

(57) ABSTRACT

In a semiconductor device that uses an N-channel MOS transistor as an electrostatic protection element, the N-channel MOS transistor has a plurality of electric field relaxing areas, three of which have in a longitudinal direction three different impurity concentrations decreasing from an N-type high concentration drain region downward, and three of which have in a lateral direction three different impurity concentrations decreasing from the N-type high concentration drain region toward a channel region. An electric field relaxing area that is in contact with the electric field relaxing areas in the longitudinal direction and with the electric field relaxing areas in the lateral direction has the lowest impurity concentration.

4 Claims, 5 Drawing Sheets

Dependence on distance between channel region and N-type low concentration diffusion region

SEMICONDUCTOR DEVICE HAVING AN ELECTROSTATIC PROTECTION ELEMENT

RELATED APPLICATIONS

This application claims priority under 35 U.S.C. § 119 to Japanese Patent Application No. 2016-069165 filed on Mar. 30, 2016, the entire content of which is hereby incorporated by reference.

BACKGROUND OF THE INVENTION

1. Field of the Invention

The present invention relates to a semiconductor device that uses an N-channel MOS transistor as an electrostatic protection element.

2. Description of the Related Art

Many semiconductor devices that has a MOS transistor as an electrostatic protection element utilize a so-called off-transistor, which is used in an off-state by connecting a drain of the N-channel MOS transistor to an external terminal and setting the gate potential and the source potential tied to the ground potential.

In a case where the N-channel MOS transistor protects an element that performs high voltage operation, a high voltage withstand structure that includes a field oxide film formed between a channel region and a drain region is used around the drain of the N-channel MOS transistor. A high voltage withstand structure that includes, around an N-type high concentration drain region, N-type low concentration diffusion regions having different impurity concentrations from each other is also used in order to improve the withstand voltage and reduce the on-resistance (see Japanese Patent Application Laid-open No. 2007-266473, for example).

An N-channel MOS transistor used as an electrostatic protection element in a semiconductor device needs to have a structure whose electric characteristics are ideally such that a first breakdown voltage and a second breakdown voltage of the transistor are equal to or higher than the rated voltage of the semiconductor device, and are lower than a first breakdown voltage and a second breakdown voltage of an internal element. In general, since a high withstand voltage increases the on-resistance, in a case where the concentration of the low concentration diffusion region is increased in order to reduce the on-resistance, the first breakdown voltage may drop to a level lower than the rated voltage or the operating voltage of the semiconductor device, resulting in a failure to fulfill desired characteristics. On the other hand, when the concentration of the diffusion region is set lower in order to raise the withstand voltage while ignoring the on-resistance, the second breakdown voltage may rise to a level at which the internal element cannot be protected.

The first breakdown voltage and the second breakdown voltage are defined in IDS-VDS characteristic of the MOS transistor. Schematic IDS-VDS characteristics are shown in FIG. 5. The first breakdown voltage is a voltage at which a drain current IDS starts to rise when a drain-source voltage VDS is raised while keeping a gate voltage at 0 V. The second breakdown voltage is a voltage at which the resistance between the drain and the source drops rapidly and a large current starts to flow when the drain-source voltage VDS is raised further.

SUMMARY OF THE INVENTION

The present invention has been made to provide a structure with which the withstand voltage of an electrostatic protection element of a semiconductor device can be adjusted adequately by the distance between diffusion regions, without changing the concentrations of the diffusion regions.

The present invention uses the following measures.

A semiconductor device includes an N-channel MOS transistor that includes: a field oxide film and a gate oxide film formed on a semiconductor substrate; a gate electrode formed on the gate oxide film, the gate electrode having one end extended to the field oxide film; an N-type high concentration source region formed at another end of the gate electrode; a channel region founded under the gate oxide film and sandwiched between the N-type high concentration source region and one end portion of the field oxide film; an N-type high concentration drain region formed at another end portion of the field oxide film which is opposite from the one end portion of the field oxide film; and electric field relaxing areas formed around the N-type high concentration drain region, in which an N-type intermediate concentration diffusion region formed under the field oxide film includes a plurality of regions varying in impurity concentration from the N-type high concentration drain region to the channel region.

Further, a method of manufacturing a semiconductor device including an N-channel MOS transistor that includes: a field oxide film and a gate oxide film formed on a semiconductor substrate; a gate electrode formed on the gate oxide film, the gate electrode having one end extended to the field oxide film; an N-type high concentration source region formed at another end of the gate electrode; a channel region formed under the gate oxide film and sandwiched between the N-type high concentration source region and one end portion of the field oxide film; an N-type high concentration drain region formed at another end portion of the field oxide film which is opposite from the one end portion of the field oxide film; and electric field relaxing areas formed around the N-type high concentration drain region, includes: forming a P-type well region and a first N-type well region on a surface of the semiconductor substrate; forming a second N-type well region so that a depth of the second N-type well region is shallower than that of the first N-type well region; forming a field oxide film and an N-type intermediate concentration diffusion region simultaneously by oxidization and diffusion of an N-type impurity introduced by ion implantation under a region where the field oxide film is to be formed; forming the channel region in a region where no field oxide film is formed; forming the gate oxide film on the channel region; forming the gate electrode on the gate oxide film; forming the N-type high concentration source region and the N-type high concentration drain region by ion implantation of an N-type impurity at a high concentration by using the gate electrode and the field oxide film as a mask; forming an interlayer insulating film; forming a contact via-hole; forming wiring; and forming a protective film.

With the use of the measures described above, the voltage characteristics of an electrostatic protection element are adequately adjusted to a desired value.

According to the present invention, structures that affect the first breakdown and the second breakdown are the distance between the channel region and the N-type low concentration diffusion region (the second N-type well region) and the distance between the N-type low concentration diffusion region (the second N-type well region) and the first N-type well region, and a structure that affects the second breakdown is the distance between the N-type low concentration diffusion region (the second N-type well region) and the N-type high concentration diffusion region (the N-type high concentration drain region). One of the distances of the structures is changed while the other two distances are maintained, thereby accomplishing the adjustment of the first breakdown voltage and the second breakdown voltage to desired voltages.

DETAILED DESCRIPTION OF THE PREFERRED EMBODIMENTS

Embodiments for an electrostatic protection element of a semiconductor device in the present invention are described below with reference to the drawings.

Figure 1:
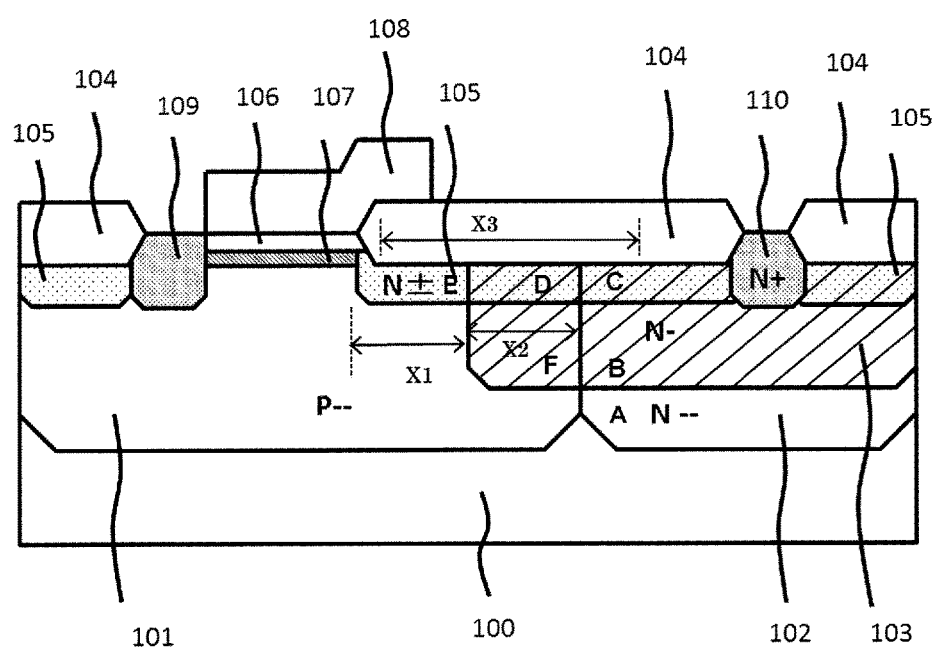
FIG. 1 is a schematic sectional view of an electrostatic protection element of a semiconductor device according to an embodiment of the present invention.

FIG. 1 is a schematic sectional view of an electrostatic protection element of a semiconductor device according to an embodiment of the present invention in which an N-channel MOS transistor is used.

The N-channel MOS transistor has an LDMOS structure, which is used for high voltage withstand operation, and includes a P or N conductivity type semiconductor substrate 100 on which a P-type well region 101 and an N-type well region 102 are formed. A gate oxide film 106 is formed on a part of a substrate surface of the P-type well region 101, and a gate electrode 108 is formed on the gate oxide film 106. A part of the gate electrode 108 extends to a field oxide film 104, which is formed on the substrate by Local Oxidation of Silicon (LOCOS). An N-type high concentration source region 109 is formed at one end portion of the gate electrode 108. A channel region 107 is formed under the gate oxide film 106, which is sandwiched between the N-type high concentration source region 109 and the field oxide film 104. The part of the gate electrode 108 is extended to one end portion of the field oxide film 104, and the N-type well region 102 is located under the other end portion of the field oxide film 104. An N-type high concentration drain region 110 is formed in a part of the substrate surface that is in the N-type well region 102, at a depth of 0.4 µm from the substrate surface. An N-type intermediate concentration diffusion region 105 is formed under the field oxide film 104.

The N-type intermediate concentration diffusion region 105 has an impurity concentration of from $4e16/cm^3$ to $10e16/cm^3$, and is formed at a depth of 0.5 µm from the bottom of the field oxide film 104. An N-type low concentration diffusion region 103 is also formed in the N-type well region 102 at a diffusion depth deeper than that of the N-type intermediate concentration diffusion region 105. The N-type low concentration diffusion region 103 stretches from the N-type well region 102 to a part of the P-type well region 101. However, the forming of the N-type low concentration diffusion region 103 by diffusion is controlled so that its end portion does not overlap with the gate electrode 108.

The P-type well region 101, the N-type well region 102, the N-type low concentration diffusion region 103, and the N-type intermediate concentration diffusion region 105 form areas, which have different impurity concentration with each other, operating as electric field relaxing areas by itself or by overlapping with other region(s). Since the substrate is common to all areas, no mention will be made to the substrate. Now areas A to F are defined as follows:

Area A consisting of the N-type well region 102;

Area B consisting of the N-type well region 102 and the N-type low concentration diffusion region 103;

Area C consisting of the N-type well region 102 and the N-type low concentration diffusion region 103 and the N-type intermediate concentration diffusion region 105;

Area D consisting of the P-type well region 101 and the N-type low concentration diffusion region 103 and the N-type intermediate concentration diffusion region 105;

Area E consisting of the P-type well region 101 and the N-type intermediate concentration diffusion region 105; and Area F consisting of the P-type well region 101 and the N-type low concentration diffusion region 103.

Consequently the impurity concentration of the electric field relaxing areas gradually increases in a lateral direction from the channel region 107 toward the N-type high concentration drain region 110 in the order of areas E, D, and C. The impurity concentration of the electric field relaxing areas gradually increases in a longitudinal direction from the N-type well region 102 toward the N-type high concentration drain region 110 in the order of areas A, B, and C. The area F is an electric field relaxing area formed from an N-type low concentration diffusion region that has the lowest impurity concentration. A first breakdown voltage and a second breakdown voltage of the N-channel MOS transistor are varied depending on the arrangement of the six N-type diffusion regions, which are electric field relaxing areas having different impurity concentrations.

Figure 2:
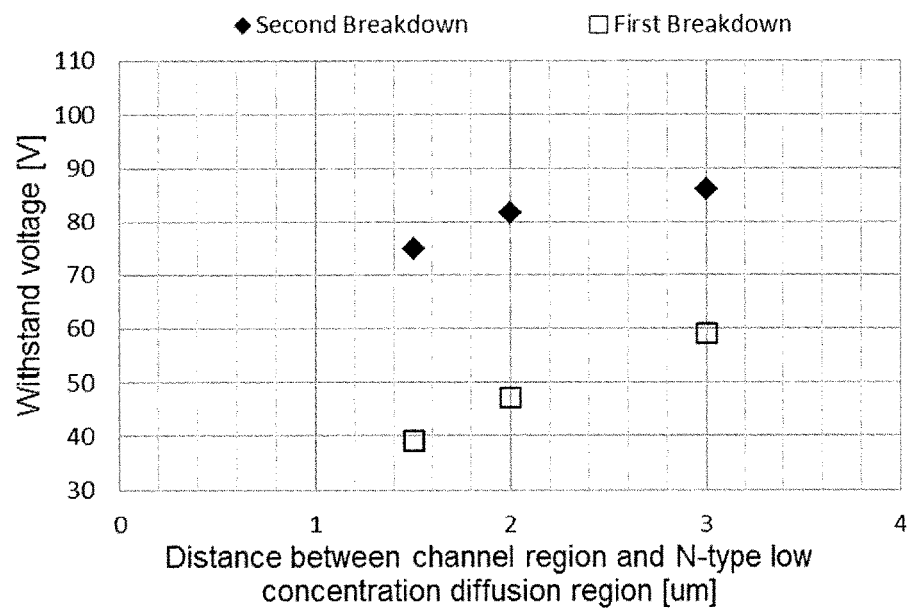
FIG. 2 is a characteristic diagram of the electrostatic protection element of the semiconductor device according to the embodiment of the present invention.

FIG. 2 is a diagram for showing changes in the characteristics of the electrostatic protection element that are observed when a distance X1 between the channel region 107 and the N-type low concentration diffusion region 103 is changed while the distance between the N-type low concentration diffusion region 103 and the N-type well region 102, the distance between the N-type low concentration diffusion region 103 and the N-type high concentration drain region 110, which is an N-type high concentration diffusion region, and the distance between the N-type low concentration diffusion region 103 and the N-type high concentration source region 109 are fixed. The change in distance causes a change in two characteristics, the first breakdown voltage and the second breakdown voltage. Specifically, the electrostatic protection element exhibits a tendency in that an increase in the distance X1 raises the first breakdown voltage and the second breakdown voltage.

Figure 3:
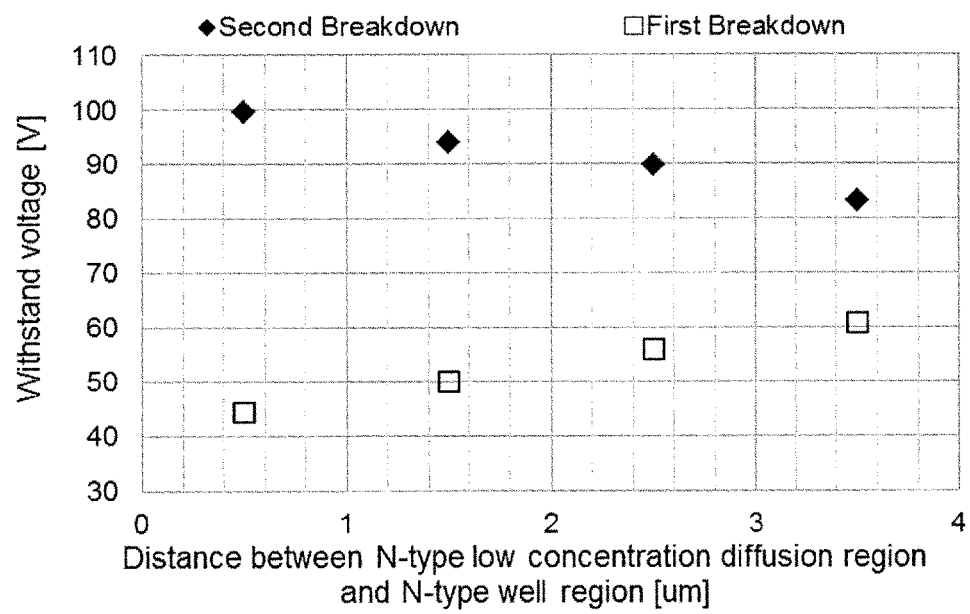
FIG. 3 is a characteristic diagram of the electrostatic protection element of the semiconductor device according to the embodiment of the present invention.

FIG. 3 is a diagram for showing changes in the characteristics of the electrostatic protection element that are observed when a distance X2 between the N-type low concentration diffusion region 103 and the N-type well region 102 is changed while the distance between the N-type low concentration diffusion region 103 and the N-type high concentration drain region 110, which is the N-type high concentration diffusion region, the distance between the N-type low concentration diffusion region 103 and the N-type high concentration source region 109, and the distance between the channel region 107 and the N-type low concentration diffusion region 103 are fixed. The change in distance causes a change in two characteristics, the first breakdown voltage and the second breakdown voltage. Specifically, the electrostatic protection element exhibits a tendency in that an increase in the distance X2 raises the first breakdown voltage and lowers the second breakdown voltage.

Figure 4:
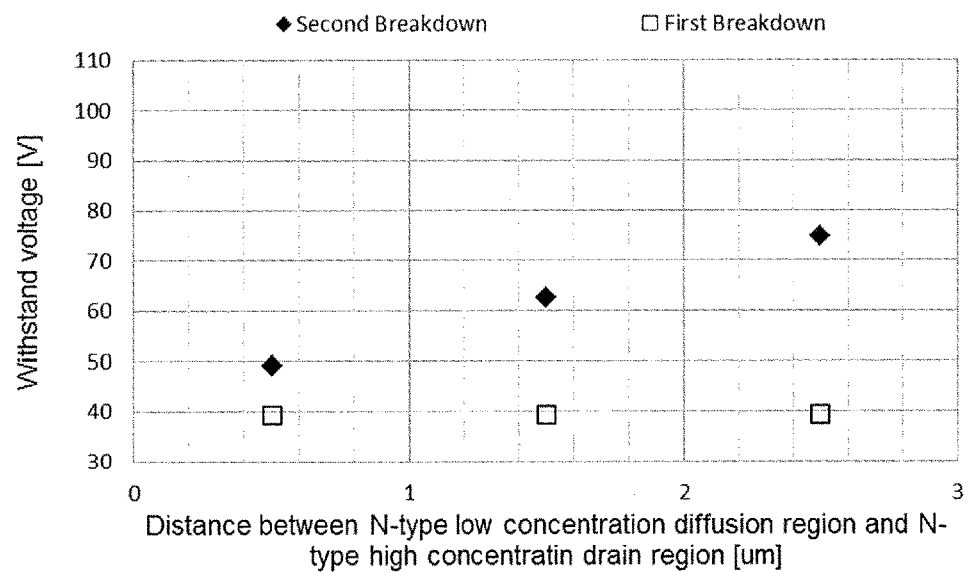
FIG. 4 is a characteristic diagram of the electrostatic protection element of the semiconductor device according to the embodiment of the present invention.
Figure 5:
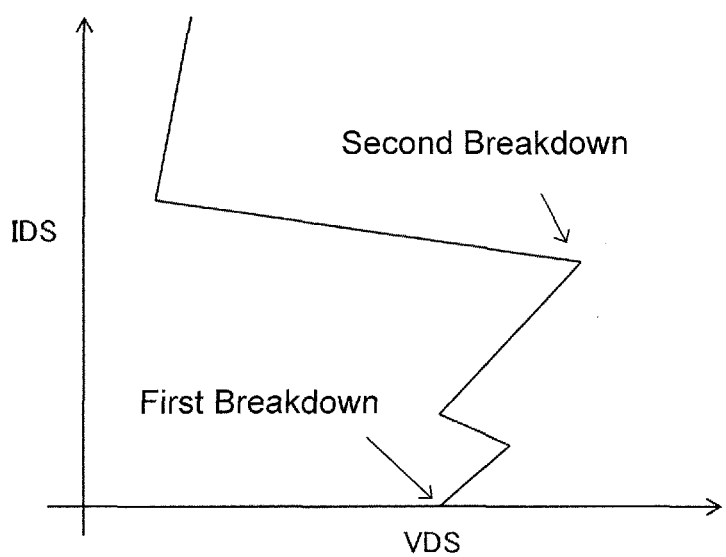
FIG. 5 is an IDS-VDS characteristic diagram of an N-channel MOS transistor.

FIG. 4 is a diagram for showing changes in the characteristics of the electrostatic protection element that are observed when a distance X3 between the N-type low concentration diffusion region 103 and the N-type high concentration drain region 110 is changed while the distance between the channel region 107 and the N-type low concentration diffusion region 103 and the distance between the N-type low concentration diffusion region 103 and the N-type well region 102 are fixed. The change in distance changes the second breakdown voltage alone, whereas the first breakdown voltage remains fixed. Specifically, an increase in the distance X3 raises the second breakdown voltage but keeps the first breakdown voltage substantially constant.

To obtain an electrostatic protection element that is an N-channel MOS transistor having a desired first breakdown voltage and a desired second breakdown voltage, for example, the first breakdown voltage and the second breakdown voltage are changed and the first breakdown voltage is adjusted to a desired value by changing the distance X1 between the channel region and the N-type low concentration diffusion region alone as shown in FIG. 2, or by changing the distance X2 between the N-type low concentration diffusion region and the N-type well region alone as shown in FIG. 3, and then the second breakdown voltage is adjusted to a desired value while the desired first breakdown voltage is maintained, by changing the distance X3 between the N-type low concentration diffusion region and the N-type high concentration diffusion region alone as shown in FIG. 4.

A semiconductor device that uses an N-channel MOS transistor as an electrostatic protection element is demanded to have an electrostatic protection element that has the first breakdown voltage and the second breakdown voltage lower than the first breakdown voltage and the second breakdown voltage of an inner element respectively. With the method described above, an electrostatic protection element that is an N-channel MOS transistor having desired breakdown voltages can easily be obtained.

A brief description is given next on a method of manufacturing the electrostatic protection element of the semiconductor device of the present invention with reference to FIG. 1.

The P-type well region 101 and the N-type well region 102 are formed first on a surface of the semiconductor substrate 100 to have a depth of approximately 5 μm. The N-type low concentration diffusion region 103, which is the second N-type well region, is formed next to have a depth shallower than that of the N-type well region 102, from about 1 μm to about 2 μm. The N-type low concentration diffusion region 103 is formed also in a part of the P-type well region 101 in addition to the N-type well region 102 so that the four electric field relaxation areas B, C, D, and F of FIG. 1 are distinguished.

Phosphorus (P), which is an N-type impurity, is injected by ion implantation under a region where the field oxide film 104 is to be formed, and then the field oxide film 104 and the N-type intermediate concentration diffusion region 105 are formed simultaneously by oxidization and diffusion. The N-type intermediate concentration diffusion region 105 formed has a concentration of approximately $5e16/cm^3$ alone. In the region e of FIG. 1, the N-type impurity concentration of the N-type intermediate concentration diffusion region 105 is lower due to the P-type well region 101. The N-type impurity concentration of the N-type intermediate concentration diffusion region 105 is higher than the concentration of the N-type intermediate concentration diffusion region 105 alone in the area D due to the N-type low concentration diffusion region 103, and is even higher in the area C.

Next, ion implantation of an impurity for formation of the channel region 107 is carried out in a region where the field oxide film 104 is not formed. Thereafter, the gate oxide film 106 is formed on the channel region 107 of the semiconductor substrate surface, and the gate electrode 108 is formed on the gate oxide film 106. The gate electrode 108 and the field oxide film 104 are used as a mask to inject an N-type impurity by ion implantation at a high concentration. The N-type high concentration source region 109 and the N-type high concentration drain region 110 are formed as a result. Though not shown, an interlayer insulating film forming step, a contact via-hole forming step, a wiring step, a protective film forming step, and other steps are executed further to form the semiconductor device of the present invention.

To manufacture a semiconductor device that includes as an electrostatic protection element an N-channel MOS transistor that has a desired first breakdown voltage and a desired second breakdown voltage, the first breakdown voltage and the second breakdown voltage are changed and the first breakdown voltage is adjusted to a desired value by changing the distance X1 between the channel region and the N-type low concentration diffusion region alone as shown in FIG. 2, or by changing the distance X2 between the N-type low concentration diffusion region and the N-type well region alone as shown in FIG. 3, and then the second breakdown voltage is adjusted to a desired value while the desired first breakdown voltage is maintained, by changing the distance X3 between the N-type low concentration diffusion region and the N-type high concentration diffusion region alone as shown in FIG. 4.

What is claimed is:

1. A semiconductor device comprising an N-channel MOS transistor, the N-channel MOS transistor comprising:
 a field oxide film and a gate oxide film on a semiconductor substrate;
 a gate electrode on the gate oxide film, the gate electrode having a first end extending to the field oxide film;
 an N-type high concentration source region at a second end of the gate electrode;
 a channel region under the gate oxide film and sandwiched between the N-type high concentration source region and a first end portion of the field oxide film;
 an N-type high concentration drain region at a second end portion of the field oxide film opposite from the first end portion of the field oxide film; and
 a plurality of electric field relaxing areas under the field oxide film, and around the N-type high concentration drain region, the plurality of electric field relaxing areas comprising:
  first electric field relaxing areas each extending in a longitudinal direction, such that three different impurity concentration regions decrease in concentration from the N-type high concentration drain region downward, second electric field relaxing areas each extending in a lateral direction, such that three different impurity regions decrease in concentration from the N-type high concentration drain region toward the channel region, and a third electric field relaxing area contacting the electric field relaxing areas in the longitudinal direction and the electric field relaxing areas in the lateral direction and displaced from the channel region by an intermediate one of the second electric field relaxing areas, and having a lowest in impurity concentration among the plurality of electric field relaxing areas, wherein the intermediate one and an adjacent one of the second electric field relaxing areas and the third electric field relaxing area reside in a P-type well region.

2. A semiconductor device comprising an N-channel MOS transistor, the N-channel MOS transistor comprising:
a field oxide film and a gate oxide film on a semiconductor substrate;
a gate electrode on the gate oxide film, the gate electrode having a first end extending to the field oxide film;
an N-type high concentration source region at a second end of the gate electrode;
a channel region under the gate oxide film and sandwiched between the N-type high concentration source region and a first end portion of the field oxide film;
an N-type high concentration drain region at a second end portion of the field oxide film opposite from the first end portion of the field oxide film; and
a plurality of electric field relaxing areas under the field oxide film, and around the N-type high concentration drain region, the plurality of electric field relaxing areas comprising:
electric field relaxing areas extending in a longitudinal direction, such that three different impurity concentration regions decrease in concentration from the N-type high concentration drain region downward,
electric field relaxing areas each extending in a lateral direction, such that three different impurity regions decrease in concentration from the N-type high concentration drain region toward the channel region, and
an electric field relaxing area contacting the electric field relaxing areas in the longitudinal direction and the electric field relaxing areas in the lateral direction, and having a lowest in impurity concentration among the plurality of electric field relaxing areas,
wherein the plurality of electric field relaxing areas comprise regions where an N-type intermediate concentration diffusion region overlaps with a P-type well region, with a first N-type well region, and with a second N-type well region.

3. A semiconductor device according to claim 2, wherein the first N-type well region has a depth in the semiconductor substrate that is deeper than a depth of the second N-type well region, and the depth in the semiconductor substrate of the second N-type well region is deeper than a depth of the N-type intermediate concentration diffusion region.

4. A semiconductor device according to claim 2, wherein the second N-type well region does not overlap the first end of the gate electrode that extends to the top of the field oxide film.

* * * * *